(12) United States Patent
You (10) Patent No.: US 9,786,729 B2
(45) Date of Patent: Oct. 10, 2017

(54) ORGANIC LIGHT-EMITTING DIODE DISPLAY AND METHOD OF MANUFACTURING THE SAME

(71) Applicant: Samsung Display Co., Ltd., Yongin, Gyeonggi-Do (KR)

(72) Inventor: Chungi You, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 4 days.

(21) Appl. No.: 14/806,415

(22) Filed: Jul. 22, 2015

(65) Prior Publication Data

US 2016/0240598 A1 Aug. 18, 2016

(30) Foreign Application Priority Data

Feb. 13, 2015 (KR) .................. 10-2015-0022714

(51) Int. Cl.
*H01L 27/32* (2006.01)

(52) U.S. Cl.
CPC ................. *H01L 27/3276* (2013.01)

(58) Field of Classification Search
CPC ..................................... H01L 27/326
See application file for complete search history.

(56) References Cited

U.S. PATENT DOCUMENTS

| | | | |
|---|---|---|---|
| 9,076,745 B2* | 7/2015 | Choi | .................. H01L 51/5246 |
| 2004/0253756 A1 | 12/2004 | Cok et al. | |
| 2010/0102335 A1 | 4/2010 | Takagi et al. | |
| 2014/0183460 A1 | 7/2014 | Kim et al. | |
| 2014/0374732 A1* | 12/2014 | Jeong | .................. H01L 27/3246 257/40 |

FOREIGN PATENT DOCUMENTS

| | | |
|---|---|---|
| JP | 2005-11810 A | 1/2005 |
| JP | 2006-286493 A | 10/2006 |
| JP | 2010-108693 A | 5/2010 |
| KR | 10-2014-0141529 A | 12/2014 |

* cited by examiner

*Primary Examiner* — Yu-Hsi D Sun
(74) *Attorney, Agent, or Firm* — Knobbe, Martens, Olson & Bear, LLP (57) ABSTRACT

An organic light-emitting diode (OLED) display and a method of manufacturing an OLED display are disclosed. In one aspect, the display includes a display substrate including a display area and a non-display area surrounding the display area. Also included is a thin film transistor (TFT) formed over the display area and including a semiconductor active layer, a gate electrode, a source electrode, and a drain electrode. An OLED is formed over the display area and includes a first electrode electrically connected to the TFT, an intermediate layer, and a second electrode. A plurality of power wirings are formed over the non-display area and are electrically connected to the second electrode so as to form an electrode contact. The display also includes a plurality of insulating layers formed over the display substrate and configured to insulate the TFT, the OLED, and the power wirings from one another.

20 Claims, 4 Drawing Sheets

FIG. 7

ORGANIC LIGHT-EMITTING DIODE DISPLAY AND METHOD OF MANUFACTURING THE SAME

INCORPORATION BY REFERENCE TO ANY PRIORITY APPLICATIONS

This application claims the benefit of Korean Patent Application No. 10-2015-0022714, filed on Feb. 13, 2015, in the Korean Intellectual Property Office, the disclosure of which is incorporated herein in its entirety by reference.

BACKGROUND

Field

The described technology generally relates to an organic light-emitting diode (OLED) display and a method of manufacturing the same.

Description of the Related Technology

Generally, OLED displays are used in mobile devices, such as smartphones, tablet computers, laptop computers, digital cameras, camcorders, personal digital assistants, etc., and in electronic devices, such as ultra thin TVs and advertisement panels.

In OLED displays, an organic emission layer is interposed between an anode and a cathode. The cathode and a power wiring can contact each other in a non-display area which can cause defects in the display. Thus, preventing film separation in a cathode contact portion is desired.

SUMMARY OF CERTAIN INVENTIVE ASPECTS

One inventive aspect relates to an OLED display and a method of manufacturing the same.

Another aspect is an OLED display that includes: a thin film transistor (TFT) formed on a display area of a display substrate, the TFT including a semiconductor active layer, a gate electrode, a source electrode, and a drain electrode; an organic light-emitting device (OLED) formed on the display area of the display substrate, the OLED including a first electrode that is electrically connected to the TFT, an intermediate layer, and a second electrode; power wirings formed on a non-display area extending outwardly from the display area of the display substrate, and electrically connected to the second electrode to form an electrode contact; and a plurality of insulating layers formed among the TFT, the OLED, and the power wirings and insulating the TFT, the OLED, and the power wirings from one another, wherein a plurality of contact holes are formed in one of the plurality of insulating layers, a portion of the power wirings is exposed via an opening of the insulating layer, and a wiring electrode is formed on an outer surface of the insulating layer defining the plurality of contact holes and electrically connects the second electrode and the power wirings to one another.

The wiring electrode can be formed on the same layer as the first electrode and is electrically connected to the exposed portion of the power wirings. The second electrode extending over the display area and the non-display area can be formed on the wiring electrode.

The wiring electrode can be formed over an upper surface of the insulating layer, a side surface of the insulating layer defining the plurality of contact holes, a bottom surface between neighboring insulating layers, and the exposed portion of the power wirings.

The wiring electrode can integrally extend.

The plurality of contact holes can be formed through the insulating layer to expose a surface of another insulating layer formed below the insulating layer.

Depths of the plurality of contact holes can be equal to or greater than 2 micrometers.

The power wirings, the wiring electrode, and the second electrode can be electrically connected to one another so as to form an electrode contact portion.

The intermediate layer can include an organic emission layer and at least one pattern layer stacked on at least one surface of the organic emission layer. The organic emission layer can be formed in each pixel of the display area, and the at least one pattern layer can extend over the display area and the non-display area.

The at least one pattern layer can be formed on the wiring electrode, on an upper surface of the insulating layer in which the plurality of contact holes are formed and on a bottom surface between neighboring insulating layers. The wiring electrode can penetrate the at least one pattern layer to be electrically connected to the second electrode.

The at least one pattern layer can not be formed on the side surface of the insulating layer defining the plurality of contact holes. The second electrode and the wiring electrode can be directly connected to each other on the side surface of the insulating layer.

The at least one pattern layer can include at least one of a hole injection layer, a hole transport layer, an electron injection layer, and an electron transport layer.

The power wirings can include a first wiring formed on the same layer as the gate electrode and a second wiring electrically connected to the first wiring and formed on the same layer as the source electrode and the drain electrode.

The insulating layer can include a gate insulating layer, an interlayer insulating layer, a planarization layer, and a pixel-defining layer. The first wiring and the gate electrode can be formed on the gate insulating layer. The second wiring, the source electrode, and the drain electrode can be formed on the interlayer insulating layer. The wiring electrode and the first electrode can be formed on the planarization layer.

Another aspect is a method of manufacturing an OLED display that includes: forming in a display area of a display substrate a thin film transistor (TFT), the TFT including a semiconductor active layer, a gate electrode, a source electrode, and a drain electrode, and forming in a non-display area of the display substrate power wirings; forming an insulating layer exposing at least a portion of the power wirings and including a plurality of contact holes; forming in the display area of the display substrate a first electrode and an intermediate layer provided in an organic light-emitting device (OLED), and forming in the non-display area of the display substrate a wiring electrode on the same layer as the first electrode; and forming a second electrode electrically connected to the power wirings and the wiring electrode and provided in the OLED.

The forming of the insulating layer can include forming a stair gap between a portion in which the insulating layer is formed and a portion in which the insulating layer is not formed, due to the plurality of contact holes.

The forming of the wiring electrode can include forming the wiring electrode on the insulating layer defining the plurality of contact holes and electrically connecting the wiring electrode to the exposed portion of the power wirings.

The wiring electrode can extend over an upper surface of the insulating layer, a side surface of the insulating layer defining the plurality of contact holes, a bottom surface between neighboring insulating layers, and the exposed portion of the power wirings.

The intermediate layer can include an organic emission layer, and at least one pattern layer stacked on at least a surface of the organic emission layer. The organic emission layer can be formed in each pixel of the display area, and the at least one pattern layer can be formed over the display area and the non-display area.

The at least one pattern layer can include at least one of a hole injection layer, a hole transport layer, an electron injection layer, and an electron transport layer. The at least one pattern layer can be formed on the wiring electrode, on an upper surface of the insulating layer in which the plurality of contact holes are formed and on a bottom surface between neighboring insulating layers, but not on a side surface of the insulating layer defining the plurality of contact holes, and the second electrode and the wiring electrode can be directly connected to each other on the side surface of the insulating layer.

After the second electrode is formed, a laser beam can be irradiated onto the upper surface of the insulating layer and the bottom surface between the neighboring insulating layers, toward the second electrode, in order to melt the at least one pattern layer between the second electrode and the wiring electrode so that the second electrode penetrates the at least one pattern layer to be electrically connected to the wiring electrode.

Another aspect is an organic light-emitting diode (OLED) display comprising: a display substrate including a display area and a non-display area surrounding the display area; a thin film transistor (TFT) formed over the display area, and comprising a semiconductor active layer, a gate electrode, a source electrode, and a drain electrode; an OLED formed over the display area and comprising a first electrode electrically connected to the TFT, an intermediate layer, and a second electrode; a plurality of power wirings formed over the non-display area and electrically connected to the second electrode so as to form an electrode contact; a plurality of insulating layers formed over the display substrate and configured to insulate the TFT, the OLED, and the power wirings from one another, wherein the insulating layers comprise first and second insulation layers, wherein the first insulating layer includes a plurality of contact holes and on opening, and wherein a portion of the power wirings is exposed via the opening; and a wiring electrode formed over an outer surface of the first insulating layer and configured to electrically connect the second electrode to the power wirings, wherein the wiring electrode defines the contact holes.

In the above OLED display, the wiring electrode is formed on the same layer as the first electrode and is electrically connected to the exposed portion of the power wirings, wherein the second electrode is formed over the display area, and contacts at least a portion of the non-display area, and the wiring electrode.

In the above OLED display, the first insulating layer includes an upper surface, a side surface, and a bottom surface formed between the first and second insulating layers, wherein the wiring electrode is formed over the upper, side and bottom surfaces of the first insulating layer and the exposed portion of the power wirings.

In the above OLED display, the wiring electrode is integrally formed.

In the above OLED display, the contact holes expose a surface of a second one of the insulating layers formed below the first insulating layer.

In the above OLED display, the depths of the contact holes are equal to or greater than about 2 micrometers.

In the above OLED display, the power wirings, the wiring electrode, and the second electrode are electrically connected to one another so as to form an electrode contact portion.

In the above OLED display, the display area includes a plurality of pixels, wherein the intermediate layer comprises an organic emission layer and at least one pattern layer stacked on at least one surface of the organic emission layer, wherein the organic emission layer is formed in each pixel, and wherein the at least one pattern layer is formed over the display area and the non-display area.

In the above OLED display, the first insulating layer includes an upper surface and a bottom surface formed between the first insulating layer and a second one of the insulating layers, wherein the at least one pattern layer is formed over the wiring electrode and the upper and bottom surfaces of the first insulating layer, and wherein the wiring electrode penetrates the at least one pattern layer and is electrically connected to the second electrode.

In the above OLED display, the first insulating layer includes a side surface defining the contact holes, wherein the at least one pattern layer is not formed over the side surface of the first insulating layer, and wherein the second electrode and the wiring electrode are directly connected to each other over the side surface of the first insulating layer.

In the above OLED display, the at least one pattern layer comprises at least one of a hole injection layer, a hole transport layer, an electron injection layer, and an electron transport layer.

In the above OLED display, the power wirings comprise i) a first wiring formed on the same layer as the gate electrode and ii) a second wiring electrically connected to the first wiring and formed on the same layer as the source and drain electrodes.

In the above OLED display, the insulating layers comprise a gate insulating layer, an interlayer insulating layer, a planarization layer, and a pixel-defining layer, wherein the first wiring and the gate electrode are formed over the gate insulating layer, wherein the second wiring, the source electrode, and the drain electrode are formed over the interlayer insulating layer, and wherein the wiring electrode and the first electrode are formed over the planarization layer.

Another aspect is a method of manufacturing an organic light-emitting diode (OLED) display including a display substrate, the method comprising: foiming a thin film transistor (TFT) in a display area of the display substrate, wherein the TFT comprises a semiconductor active layer, a gate electrode, a source electrode, and a drain electrode; forming a plurality of power wirings in a non-display area of the display substrate surrounding the display area; forming an insulating layer exposing at least a portion of the power wirings and having a plurality of contact holes; forming a first electrode and an intermediate layer of an OLED in the display area; forming a wiring electrode on the same layer as the first electrode in the non-display area; and forming a second electrode of the OLED, wherein the second electrode is electrically connected to the power wirings and the wiring electrode.

In the above method, the forming of the insulating layer comprises forming a stair gap between a portion in which the insulating layer is formed and a portion in which the insulating layer is not formed.

In the above method, the insulating layer defines the contact holes, wherein the forming of the wiring electrode comprises forming the wiring electrode over the insulating layer so as to electrically connect the wiring electrode to the exposed portion of the power wirings.

In the above method, the insulating layer includes first and second insulating layers, wherein the first insulating layer includes an upper surface, a side surface, and a bottom surface formed between the first and second insulating layers, and wherein the wiring electrode is formed over the upper, side and bottom surfaces of the first insulating layer and the exposed portion of the power wirings.

In the above method, the display area includes a plurality of pixels, wherein the intermediate layer comprises an organic emission layer and at least one pattern layer stacked on at least a surface of the organic emission layer, wherein the organic emission layer is formed in each of the pixels, and wherein the at least one pattern layer is formed over the display area and the non-display area.

In the above method, the at least one pattern layer comprises at least one of a hole injection layer, a hole transport layer, an electron injection layer, and an electron transport layer, wherein the insulating layer includes first and second insulating layers, wherein the first insulating layer includes an upper surface, a side surface, and a bottom surface formed between the first and second insulating layers, wherein the at least one pattern layer is formed over the wiring electrode and the upper and bottom surfaces of the first insulating layer, and wherein the at least one pattern layer is not formed over the side surface of the first insulating layer, and wherein the second electrode and the wiring electrode are directly connected to each other on the side surface of the first insulating layer.

The above method further comprises irradiating a laser beam onto the upper and bottom surfaces of the first insulating layer toward the second electrode after the second electrode is formed so as to melt the at least one pattern layer between the second electrode and the wiring electrode such that the second electrode penetrates the at least one pattern layer, wherein the at least one pattern layer is electrically connected to the wiring electrode after the irradiating.

DETAILED DESCRIPTION OF CERTAIN INVENTIVE EMBODIMENTS

Reference will now be made in detail to exemplary embodiments, examples of which are illustrated in the accompanying drawings, wherein like reference numerals refer to like elements throughout. In this regard, the present exemplary embodiments can have different forms and should not be construed as being limited to the descriptions set forth herein. Accordingly, the exemplary embodiments are merely described below, by referring to the figures, to explain aspects of the present description.

It will be understood that although the terms "first," "second," etc. can be used herein to describe various components, these components should not be limited by these terms. These components are only used to distinguish one component from another.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof.

Reference will now be made in detail to embodiments, examples of which are illustrated in the accompanying drawings. In the drawings, the same elements are denoted by the same reference numerals, and a repeated explanation thereof will not be given. In this disclosure, the term "substantially" includes the meanings of completely, almost completely or to any significant degree under some applications and in accordance with those skilled in the art. Moreover, "formed on" can also mean "formed over." The term' "connected" can include an electrical connection.

Figure 1:
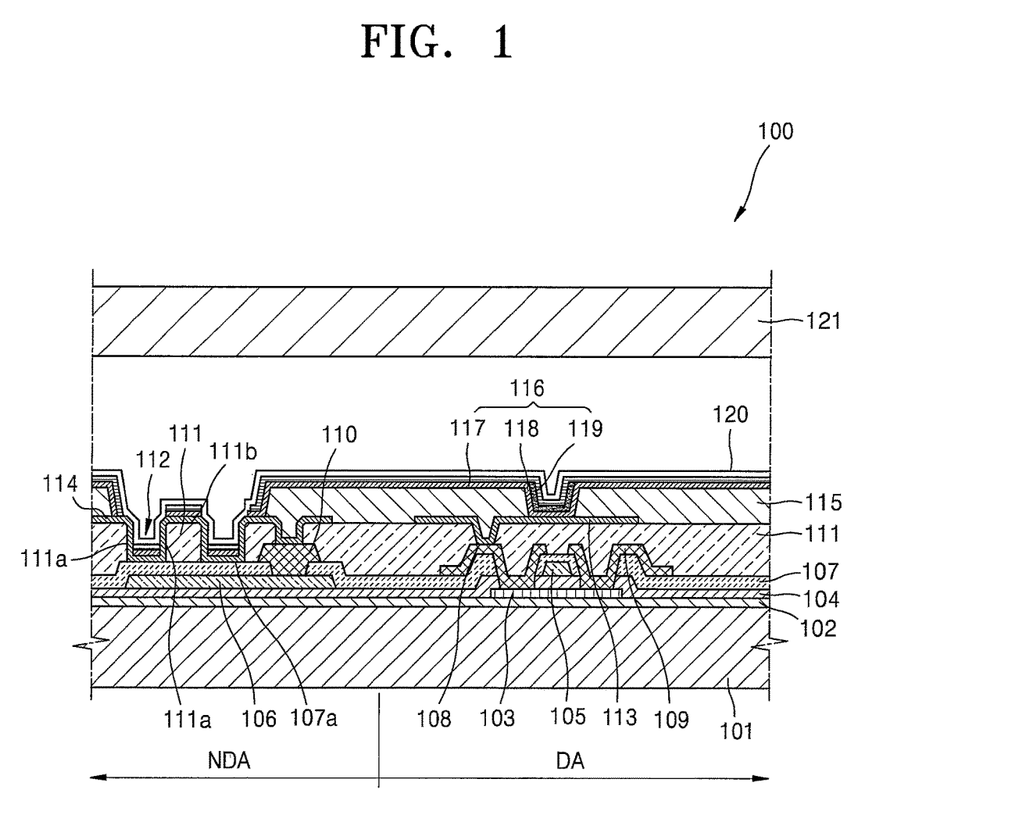
FIG. 1 is a cross-sectional view of an OLED/display according to an exemplary embodiment.

FIG. 1 is a cross-sectional view of an OLED display 100 according to an exemplary embodiment.

Referring to FIG. 1, the OLED display 100 includes a display substrate 101 and an encapsulating substrate 121 facing the display substrate 101.

The display substrate 101 can be formed of an insulating material having flexibility or an insulating material having rigidity. For example, the display substrate 101 is a flexible film, a glass substrate having rigidity, a metal substrate, or a combination thereof. The display substrate 101 can be transparent, half-transparent, or non-transparent.

The display substrate 101 includes a display area DA in which a thin film transistor (TFT) and an OLED are formed, and a non-display area NDA which extends from the display area DA toward the outside of the display substrate 101 and in which power wirings 106 and 110 are formed.

A barrier layer 102 can be formed on the display substrate 101. The barrier layer 102 can cover the whole upper surface of the display substrate 101. The barrier layer 102 includes an inorganic layer or an organic layer. For example, the barrier layer 102 is formed of any of an inorganic material, such as silicon oxide (SiOx), silicon nitride (SiNx), silicon oxynitride (SiON), aluminum oxide (AlO), and aluminum nitride (AlON), and an organic material, such as acryl, polyimide, and polyester.

The barrier layer 102 can be formed as a single layer or multiple layers. The barrier layer 102 can prevent oxygen and moisture from penetrating into the display substrate 101 and planarize the upper surface of the display substrate 101.

The TFT can be formed on the barrier layer 102. In some embodiments, the TFT is exemplified as a top gate transistor, but the TFT is not limited thereto. The TFT can include TFTs having other structures, such as a bottom gate transistor.

The TFT can be formed in the display area DA of the display substrate 101. The TFT includes a semiconductor active layer 103, a gate electrode 105, a source electrode 108, and a drain electrode 109.

The semiconductor active layer 103 can be formed on the barrier layer 102. The semiconductor active layer 103 includes a source area and a drain area that are formed by doping n-type impurity ions and p-type impurity ions, and a channel area which is interposed between the source area and the drain area and which is not doped with impurities.

The semiconductor active layer 103 can be formed of an inorganic semiconductor such as polysilicon, an organic semiconductor, or amorphous silicon.

In some exemplary embodiments, the semiconductor active layer 103 is formed of an oxide semiconductor. For example, the oxide semiconductor includes an oxide of a material selected from groups 4, 12, 13, and 14 metal elements, such as Zn, In, Ga, Sn, Cd, Ge, and Hf, and a combination thereof.

A gate insulating layer 104 can be evaporated onto the semiconductor active layer 103. The gate insulating layer 104 can be an inorganic layer formed of, for example, silicon oxide, silicon nitride, or metal oxide. The gate insulating layer 104 can be a single layer or multiple layers.

The gate electrode 105 can be formed on the gate insulating layer 104. The gate electrode 105 includes a single layer or multiple layers formed of, for example, Au, Ag, Cu, Ni, Pt, Pd, Al, Mo, and Cr. In some exemplary embodiments, the gate electrode 105 is formed of a metal alloy, such as Al:Nd and Mo:W.

An interlayer insulating layer 107 can be formed on the gate electrode 105. The interlayer insulating layer 107 can include an inorganic layer formed of, for example, silicon oxide and silicon nitride. In some exemplary embodiments, the interlayer insulating layer 107 includes an organic layer.

The source electrode 108 and the drain electrode 109 can be formed on the interlayer insulating layer 107. A contact hole can be formed in the gate insulating layer 104 and the interlayer insulating layer 107 by selectively removing parts of the gate insulating layer 104 and the interlayer insulating layer 107. Through the contact hole, the source electrode 108 can be electrically connected to the source area and the drain electrode 109 can be electrically connected to the drain area.

A protection layer (a passivation layer or a planarization layer) 111 can be formed on the source electrode 108 and the drain electrode 109. The protection layer 111 covers the source electrode 108 and the drain electrode 109. The protection layer 111 can be formed of an inorganic material, such as silicon oxide and silicon nitride, or an organic material, such as acryl, polyimide, and benzocyclobutene (BCB). The protection layer 111 can be an insulating layer.

The OLED can be formed on the TFT. The OLED can be formed in the display area DA of the display substrate 101. The OLED includes a first electrode 113, an intermediate layer 116, and a second electrode 120. The OLED can be formed on the protection layer 111.

The first electrode 113 can be electrically connected to any of the source electrode 108 and the drain electrode 109 via a contact hole formed by removing a portion of the protection layer 111.

The first electrode 113 functions as an anode, and can be formed of various conductive materials. The first electrode 113 includes a transparent electrode or a reflection electrode. For example, when the first electrode 113 is used as a transparent electrode, the first electrode 113 includes a transparent conductive layer, such as ITO, IZO, ZnO, and $In_2O_3$. When the first electrode 113 is used as a reflection electrode, a reflective layer can be formed of Ag, Mg, Al, Pt, Pd, Au, Ni, Nd, Ir, Cr, or a compound thereof, and a transparent conductive layer, such as ITO, IZO, ZnO, and $In_2O_3$, can be formed on the reflective layer.

A pixel-defining layer 115 is formed on the protection layer 111. The pixel-defining layer 115 covers a portion of the first electrode 113. The pixel-defining layer 115 defines an emission area of each pixel by surrounding edges of the first electrode 113. The first electrode 113 can be patterned in each pixel.

The pixel-defining layer 115 can be an organic layer or an inorganic layer. For example, the pixel-defining layer 115 is formed of an organic material, such as polyimide, polyamide, BCB, an acryl resin, and a phenol resin, or an inorganic material such as silicon nitride.

The pixel-defining layer 115 can be a single layer or multiple layers.

The intermediate layer 116 can be formed on the first electrode 113 in an area that is exposed by removing a portion of the pixel-defining layer 115. The intermediate layer 116 has a structure in which a plurality of layers are stacked. For example, the intermediate layer 116 includes an organic emission layer 118 and at least one pattern layer 117 or 119 formed on at least one surface of the organic emission layer 118.

For example, the intermediate layer 116 includes the organic emission layer 118, and in addition to the organic emission layer 118, further includes at least one selected from a hole injection layer HIL, a hole transport layer HTL, an electron transport layer ETL, and an electron injection layer EIL. In some exemplary embodiments, the intermediate layer 116 is not limited thereto, and further includes various function layers, such as a scattering layer, in addition to the organic emission layer 118.

In some embodiments, a first pattern layer 117 is formed between the first electrode 113 and the organic emission layer 118. The first pattern layer 117 can include a HIL and a HTL. A second pattern layer 119 can be formed between the organic emission layer 118 and the second electrode 120. The second pattern layer 119 can include an ETL and an EIL.

Holes and electrons respectively injected from the first electrode 113 and the second electrode 120 can be combined in the organic emission layer 118 so as to emit light of a desired color.

In some exemplary embodiments, the organic emission layer 118 is formed in an area corresponding to each pixel, and the first pattern layer 117 and the second pattern layer 119 are common layers that extend over the display area DA and the non-display area NDA.

The second electrode 120 can be formed on the intermediate layer 116.

The second electrode 120 can function as a cathode. The second electrode 120 includes a transparent electrode or a reflection electrode. For example, when the second electrode 120 is used as a transparent electrode, metals having a low work function, for example, lithium (Li), calcium (Ca), lithium fluoride (LiF)/Ca, LiF/Al, Al, magnesium (Mg), or a combination thereof is deposited on the intermediate layer, and a transparent conductive layer formed of ITO, IZO, ZnO, $In_2O_3$, etc. is formed on the above metals or combination thereof. When the second electrode 120 is used as a reflection electrode, the second electrode 120 can be formed of Li, Ca, LiF/Ca, LiF/Al, Al, Mg, and a compound thereof.

In some exemplary embodiments, the second electrode 120 is a common electrode. The second electrode 120 can extend over the display area DA and the non-display area NDA. In some exemplary embodiments, the second electrode 120 includes a first portion formed in the area corresponding to each pixel and a second portion extending over the display area DA and the non-display area NDA to electrically connect a plurality of neighboring first portions.

In some exemplary embodiments, a plurality of pixels is formed on the display substrate 101, and each pixel realizes red, green, blue, or white color light. However, the described technology is not limited thereto.

In some exemplary embodiments, the intermediate layer 116 is formed on the first electrode 113, regardless of locations of the pixels. Here, the organic emission layer 118 can be formed by vertically stacking layers including emission materials emitting lights of red, green, and blue colors, or by combining the emission materials emitting lights of red, green, and blue colors.

In some exemplary embodiments, other color combinations are produced as long as white light is emitted. A color conversion layer converting the emitted white light into a pre-determined color, or a color filter can further be included.

The encapsulating substrate 121 can be formed on the OLED. The encapsulating substrate 121 can be formed to protect the intermediate layer 116 or other thin layers from external moisture or oxygen.

The encapsulating substrate 121 can be a glass having rigidity, a polymer resin, or a film having flexibility. In some exemplary embodiments, the encapsulating substrate 121 is formed by alternately stacking an organic layer and an inorganic layer on the OLED.

A cathode contact portion can be formed on the non-display area NDA of the display substrate 101.

For example, the power wirings 106 and 110 through which power is applied from the outside are formed on the non-display area NDA. The power wirings 106 and 110 can include a first wiring 106 and a second wiring 110 that is electrically connected to the first wiring 106. In some exemplary embodiments, the power wirings 106 and 110 are not limited to a particular type of structure, as long as the power wirings 106 and 110 have a wiring structure including at least one layer. For example, the power wirings 106 and 110 is a single layer or three or more layers. The power wirings 106 and 110 can be a mesh type for a voltage drop (IR drop) of the second electrode 120.

The first wiring 106 can be formed on the gate insulating layer 115. The first wiring 106 can be formed on the same layer as the gate electrode 105. The first wiring 106 can be covered by the interlayer insulating layer 107. In some embodiments, at least a portion of the first wiring 106 is not be covered by the interlayer insulating layer 107 and is exposed.

The second wiring 110 can be formed on the interlayer insulating layer 107. The second wiring 110 can be formed on the same layer as the source electrode 108 and the drain electrode 109. The second wiring 110 can be electrically connected to the first wiring 106 through an opening of the interlayer insulating layer 107.

The second wiring 110 can be covered by the protection layer 111. In some embodiments, at least a portion of the second wiring 110 is not covered by the protection layer 111 and is exposed. A plurality of contact holes 112 for a cathode contact can be formed in the protection layer 111.

The contact holes 112 can be formed in a cathode contact area. The contact holes 112 can be formed through the protection layer 111 to expose a surface of the interlayer insulating layer 107. A stair gap is formed between a portion of the cathode contact area, in which the protection layer 111 is formed, and a portion of the cathode contact area, in which the protection layer 111 is not formed due to the contact hole 112. In some exemplary embodiments, a depth of the contact hole 112 is substantially equal to or greater than about 2 micrometers. The depth of the contact hole 112 has an extent in which the first pattern layer 117 and the second pattern layer 119 are not formed on a side surface 111a of the protection layer 111, due to the stair gap in the cathode contact area.

For example, the first pattern layer 117 and the second pattern layer 119 are evaporated onto an outer surface of the protection layer 111 by an evaporation process. During the evaporation process, the first pattern layer 117 and the second pattern layer 119 can be easily evaporated on a surface that is horizontal with the protection layer 111, for example, the first and second pattern layers 117 and 119 are easily evaporated on an upper surface 111b of the protection layer 111 or a bottom surface 107a between neighboring protection layers 111. The bottom surface 107a substantially corresponds to an exposed surface of the interlayer insulating layer 107 that is formed below the protection layer 111. However, the first pattern layer 117 and the second pattern layer 119 are not easily evaporated on a surface that is substantially perpendicular to the protection layer 111, for example, the first and second pattern layers 117 and 119 are not easily evaporated on the side surface 111a of the protection layer 111 that defines the contact hole 112. In other words, the first pattern layer 117 and the second pattern layer 119 are easily evaporated on a surface that is horizontal to the protection layer 111 but are not easily evaporated on a surface that is perpendicular to the protection layer 111.

Also, even if the first pattern layer 117 and the second pattern layer 119 are evaporated on the side surface 111a of the protection layer 111, the first pattern layer 117 and the second pattern layer 119 are stacked so thinly that a wiring electrode 114, which is to be described later, and the second electrode 120 are electrically connected to each other.

The wiring electrode 114 can be formed on the protection layer 111. The wiring electrode 114 can be formed on the same layer as the first electrode 113. The wiring electrode 114 can be formed of substantially the same material as the first electrode 113. For example, the wiring electrode 114 includes a reflective layer, such as Ag, and a transparent conductive layer, such as an ITO layer, formed on the reflective layer.

The wiring electrode 114 can be electrically connected to an exposed portion of the second wiring 110. The wiring electrode 114 can be stacked on the side surface 111a of the protection layer 111. For example, the wiring electrode 114 is formed over the upper surface 111b of the protection layer 111, the side surface 111a of the protection layer 111 defining the contact holes 112, the bottom surface 107a between the neighboring protection layers 111, and the exposed portion of the second wiring 110. The wiring electrode 114 can integrally extend.

The first pattern layer 117 and the second pattern layer 119 of the OLED can be formed on the upper surface 111b of the protection layer 111. The organic emission layer 118 can be formed in the area corresponding to each pixel of the display area DA, while the first pattern layer 117 or the second pattern layer 119 can extend over the display area DA and the non-display area NDA.

As described above, in the cathode contact area, the first pattern layer 117 and the second pattern layer 119 are formed on the upper surface 111b of the protection layer 111 and the bottom surface 107a between the neighboring protection layers 111, but the first pattern layer 117 and the second pattern layer 119 are not formed on the side surface 111a of the protection layer 111.

The second electrode 120 of the OLED can be a common electrode. The second electrode 120 can extend over the display area DA and the non-display area NDA. In the cathode contact area, the second electrode 120 can be formed on the wiring electrode 114. The second electrode 120 can directly contact the wiring electrode 114 on the side surface 111a of the protection layer 111 defining the contact hole 112. Furthermore, after the second electrode 120 is evaporated, the second electrode 120 can be electrically connected to the wiring electrode 114 on the upper surface 111b of the protection layer 111 and on the bottom surface 107a between the neighboring protection layers 111, by using a laser drilling method.

As described above, the first wiring 106, the second wiring 110, the wiring electrode 114, and the second electrode 120 can be electrically connected to one another, thereby forming the cathode contact portion. Furthermore, since the contact holes 112 are formed in the cathode contact area, the cathode contact portion can increase its contact area.

Hereinafter, a method of manufacturing the OLED display 100 will be sequentially described by referring to FIGS. 1 through 7, according to an exemplary embodiment.

Figure 2:
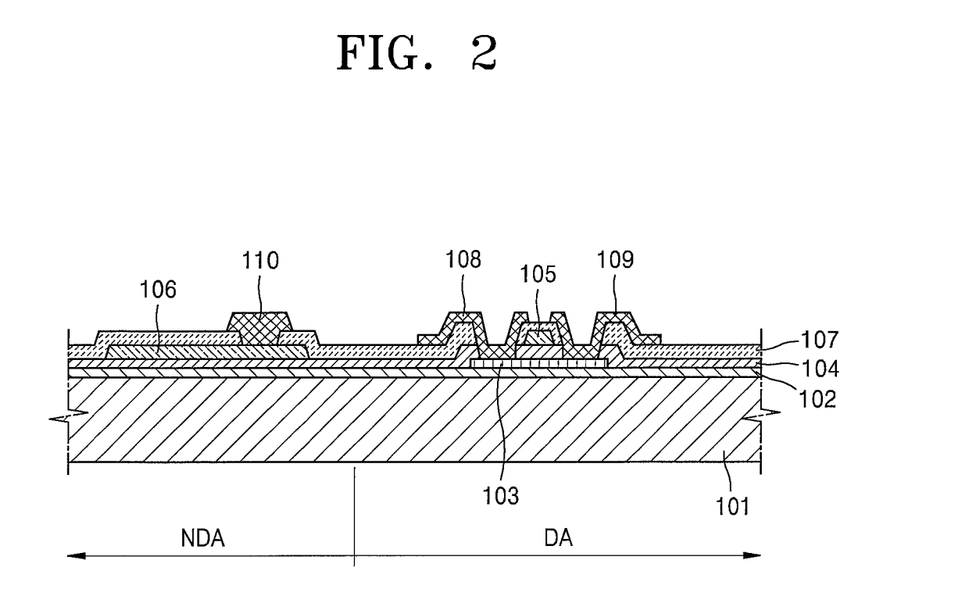
FIG. 2 is a cross-sectional view of a thin film transistor and power wirings, which are formed on a display substrate of an OLED display according to an exemplary embodiment.

Referring to FIG. 2, the barrier layer 102 is formed on the display substrate 101. The barrier layer 102 can entirely cover the display substrate 101.

The semiconductor active layer 103 is formed on the barrier layer 102, in the display area DA of the display substrate 101. The gate insulating layer 104 is formed on the semiconductor active layer 103. The gate insulating layer 104 buries the semiconductor active layer 103 by exposing a portion of the semiconductor active layer 103. The gate electrode 105 is formed on the gate insulating layer 104. The first wiring 106 is formed on the gate insulating layer 104, in the non-display area NDA of the display substrate 101. The first wiring 106 can be formed on the same layer as the gate electrode 105.

The interlayer insulating layer 107 is formed on the gate electrode 105, in the display area DA of the display substrate 101. The interlayer insulating layer 107 buries the gate electrode 105 by exposing a portion of the gate electrode 105. In the non-display area NDA, the interlayer insulating layer 107 exposes a portion of the first wiring 106, thereby burying the first wiring 106.

In the display area DA, the source electrode 108 and the drain electrode 109 are formed on the interlayer insulating layer 107. The source electrode 108 and the drain electrode 109 are electrically connected to the source area and the drain area of the semiconductor active layer 103, respectively, via contact holes formed by removing a portion of the gate insulating layer 104 and a portion of the interlayer insulating layer 107. In the non-display area NDA, the second wiring 110 is formed on the interlayer insulating layer 107. The second wiring 110 can be formed on the same layer as the source electrode 108 and the drain electrode 109. The second wiring 110 is electrically connected to the first wiring 106 through an opening of the interlayer insulating layer 107.

Figure 3:
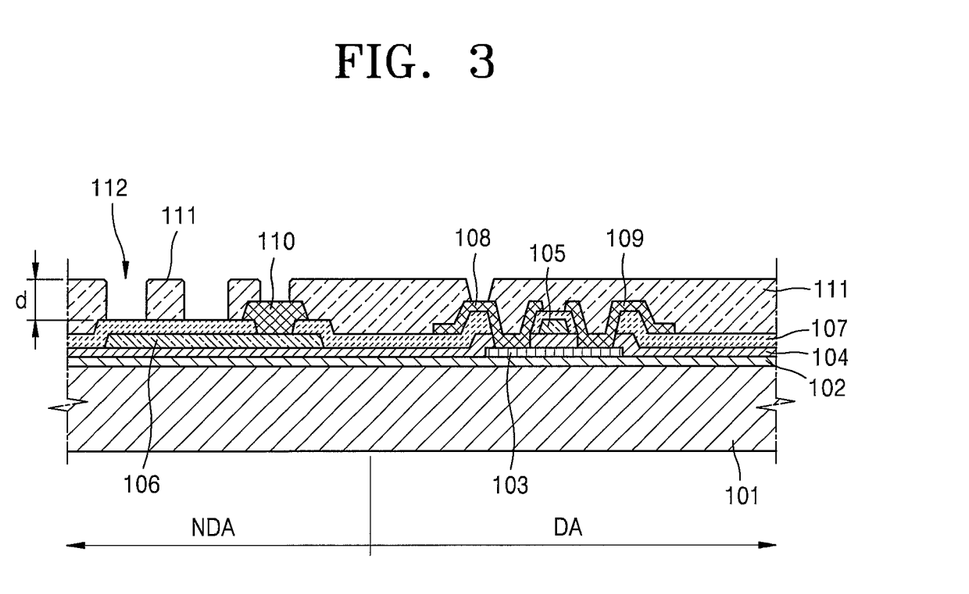
FIG. 3 is a cross-sectional view of a protection layer formed on the display substrate of FIG. 2.

Referring to FIG. 3, in the display area DA, the protection layer 111 is formed on the source electrode 108 and the drain electrode 109. The protection layer 111 exposes a portion of any of the source electrode 108 and the drain electrode 109, thereby burying the source electrode 108 and the drain electrode 109.

In the non-display area NDA, the protection layer 111 is formed to have a plurality of contact holes 112 for a cathode contact. The contact hole 112 can be formed in a multiple number. The protection layers 111 are arranged apart from one another due to the contact holes 112. The contact holes 112 are formed such that the contact holes 112 penetrate the protection layer 111 to expose a surface of the interlayer insulating layer 107. A portion of the second wiring 110 can be exposed to the outside via the contact hole 112. A depth d of the contact hole 112 is substantially equal to or greater than about 2 micrometers.

Figure 4:
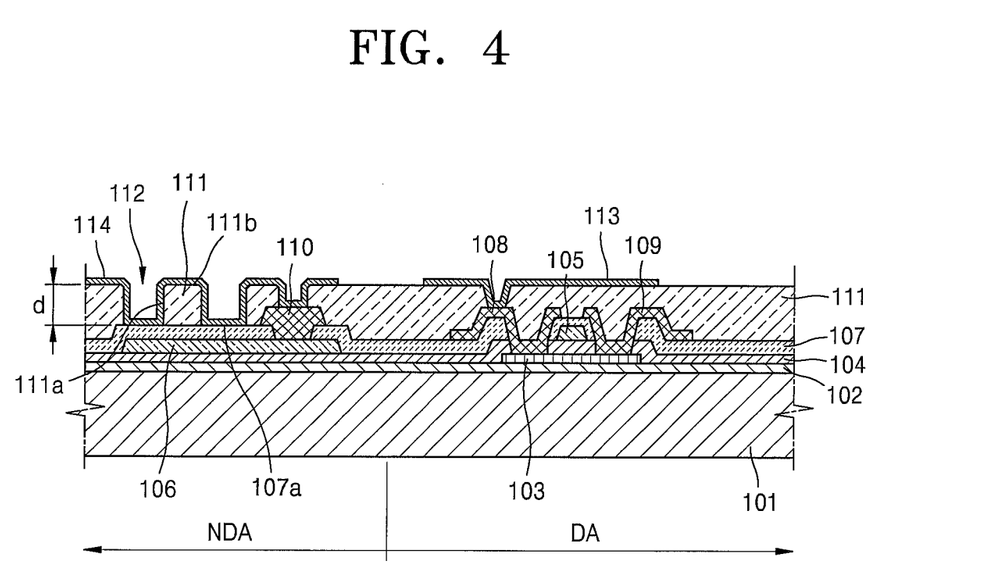
FIG. 4 is a cross-sectional view of an anode and a wiring electrode, which are formed on the display substrate of FIG. 3.

Referring to FIG. 4, in the display area DA, the first electrode 113 of the OLED is connected to any of the source electrode 108 and the drain electrode 109 via a contact hole formed by removing a portion of the protection layer 111. The first electrode 113 can include a reflective layer, such as Ag, and a transparent conductive layer, such as an ITO layer, formed on the reflective layer.

In the non-display area NDA, the wiring electrode 141 is formed on the protection layer 111. The wiring electrode 114 is formed on the same layer as the first electrode 113. The wiring electrode 113 can be formed of the same material as the first electrode 113. The wiring electrode 114 can be electrically connected to the exposed area of the second wiring 110.

The wiring electrode 114 is stacked on an outer surface of the protection layer 111. For example, the wiring electrode 114 is formed over the upper surface 111b of the protection layer 111, the side surface 111a of the protection layer 111 defining the contact holes 112, the bottom surface 107a between the neighboring protection layers 111, and the exposed portion of the second wiring 110. The wiring electrode 114 integrally extends. The bottom surface 107a substantially corresponds to an exposed surface of the interlayer insulating layer 107 formed below the protection layer 111.

Figure 5:
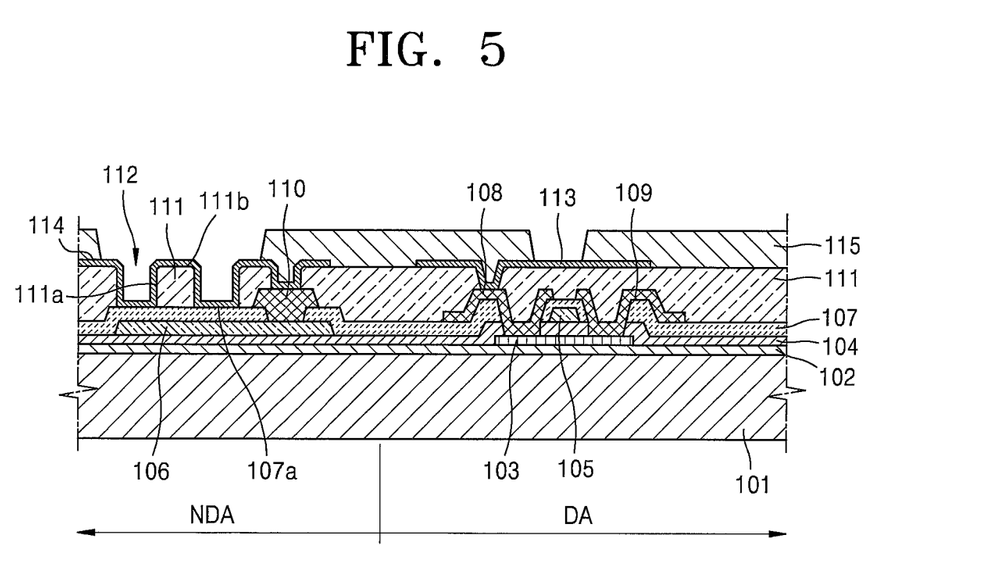
FIG. 5 is a cross-sectional view of a pixel-defining layer formed on the display substrate of FIG. 4.

Referring to FIG. 5, in the display area DA, the pixel-defining layer 115 is formed to cover edges of the first electrode 113. The pixel-defining layer 115 exposes a portion of the first electrode 113 and defines an emission area of each pixel by surrounding the edges of the first electrode 113.

In the non-display area NDA, the pixel-defining layer 115 is not formed in the cathode contact area.

Figure 6:
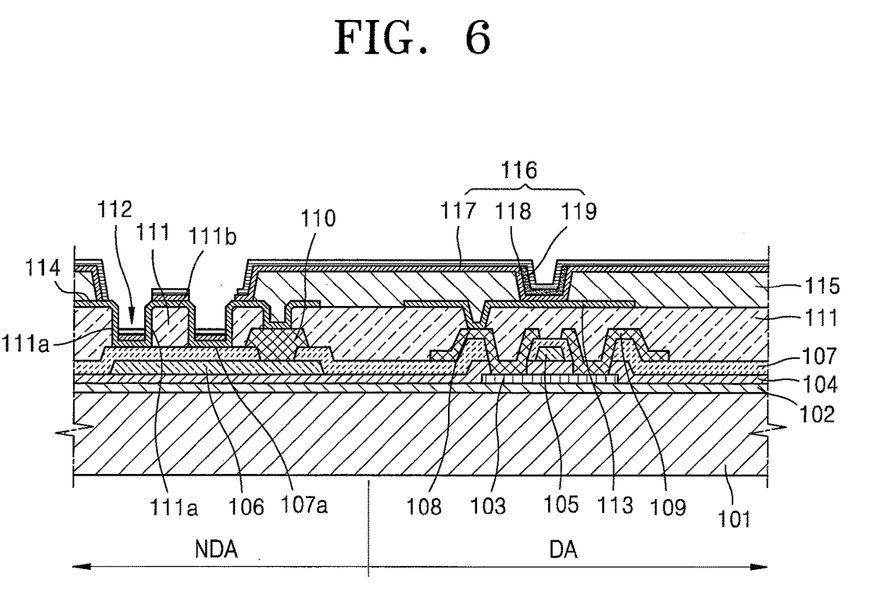
FIG. 6 is a cross-sectional view of an intermediate layer formed on the display substrate of FIG. 5.

Referring to FIG. 6, in the display area DA, the intermediate layer 116 of the OLED is formed on an exposed area of the first electrode 113.

For example, the first pattern layer 117 that is a common layer is formed on the first electrode 113. The first pattern layer 117 can include a HIL and a HTL. The first pattern layer 117 extends over the display area DA and the non-display area NDA. The organic emission layer 118 is formed on the first pattern layer 117. The organic emission layer 118 is formed in each pixel of the display area DA. The second pattern layer 119 that is a common layer is formed on the organic emission layer 118. The second pattern layer 119 can include an ETL and an EIL. The second pattern layer 119 extends over the display area DA and the non-display area NDA.

In the non-display area NDA, the first pattern layer 117 and the second pattern layer 119 are evaporated on the upper surface 111b of the protection layer 111 and on the bottom surface 107a between the neighboring protection layers 111. On the contrary, the first pattern layer 117 and the second pattern layer 119 are not evaporated on the side surface 111a of the protection layer 111, which defines the contact hole 112.

For example, a stair gap occurs between a portion of the cathode contact area, in which the protection layer 111 is formed, and a portion of the cathode contact area, in which the protection layer 111 is not formed, due to the contact holes 112. During the evaporation process, the first pattern layer 117 and the second pattern layer 119 are evaporated on the upper surface 111b of the protection layer 111 and on the bottom surface 107a between the neighboring protection layers 111, while not evaporated on the side surface 111a of the protection layer 111. Also, even if the first pattern layer 117 and the second pattern layer 119 are evaporated on the side surface 111a of the protection layer 111, the first pattern layer 117 and the second pattern layer 119 are evaporated so thinly that the wiring electrode 114 and the second electrode 120 are electrically connected to each other.

Figure 7:
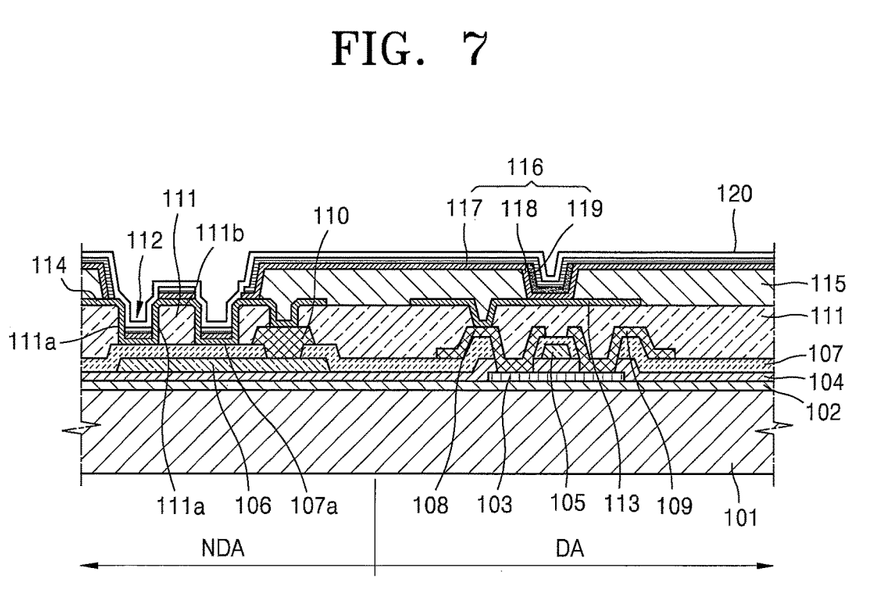
FIG. 7 is a cross-sectional view of a second electrode formed on the display substrate of FIG. 6.

Referring to FIG. 7, in the display area DA, the second electrode 120 of the OLED is formed on the intermediate layer 116. The second electrode 120 is a common electrode. The second electrode 120 extends over the display area DA and the non-display area NDA.

In the non-display area NDA, the second electrode 120 is formed on the wiring electrode 114. The second electrode 120 directly contacts the wiring electrode 114 on the side surface 111a of the protection layer 111 defining the contact hole 112. Accordingly, the first wiring 106, the second wiring 110, the wiring electrode 114, and the second electrode 120 are electrically connected to one another so as to form the cathode contact portion.

Meanwhile, after the second electrode 120 is evaporated, a process of electrically connecting the wiring electrode 114 formed on the upper surface 111b of the protection layer 111 and on the bottom layer 107a between the neighboring protection layers 111, with the second electrode 120, by a laser drilling method, can further be included.

For example, the first pattern layer 118 and the second pattern layer 119 are evaporated on the wiring electrode 114, on the upper surface 111b of the protection layer 111 and on the bottom surface 107a between the neighboring protection layers 111, and the second electrode 120 is formed on the first pattern layer 118 and the second pattern layer 119.

After the second electrode 120 is evaporated, a laser beam is irradiated onto the upper surface 111b of the protection layer 111 and the bottom surface 107a between the neighboring protection layers 111, toward the second electrode 120. Heat of the second electrode 120 heated by the laser beam is transmitted to the first pattern layer 117 and the second pattern layer 119 to melt a portion of the first pattern layer 117 and the second pattern layer 119. At that moment, the second electrode 120 can be electrically connected to the wiring electrode 114 by passing through the first pattern layer 117 and the second pattern layer 119.

Referring again to FIG. 1, the encapsulating substrate 121 is coupled to the display substrate 101. The encapsulating substrate 121 is formed on the OLED.

The OLED display 100 can be manufactured by using the above-described method.

According to at least one of the disclosed embodiments, the insulating layer having contact holes is formed in the cathode contact portion, thereby increasing contact characteristics.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While the inventive technology has been described with reference to the figures, it will be understood by those of ordinary skill in the art that various changes in form and details can be made therein without departing from the spirit and scope as defined by the following claims.

What is claimed is:

1. An organic light-emitting diode (OLED) display comprising:
a display substrate including a display area and a non-display area surrounding the display area;
a thin film transistor (TFT) formed over the display area, and comprising a semiconductor active layer, a gate electrode, a source electrode, and a drain electrode;
an OLED formed over the display area and comprising a first electrode electrically connected to the TFT, an intermediate layer, and a second electrode;
a plurality of power wirings formed over the non-display area and electrically connected to the second electrode so as to form an electrode contact;
a plurality of insulating layers formed over the display substrate and configured to insulate the TFT, the OLED, and the power wirings from one another, wherein the insulating layers comprise first and second insulation layers, wherein the first insulating layer includes a plurality of contact holes and one opening, and wherein a portion of the power wirings is exposed via the opening; and
a wiring electrode formed over an outer surface of the first insulating layer and configured to electrically connect the second electrode to the power wirings, wherein the wiring electrode defines the contact holes.

2. The OLED display of claim 1, wherein the wiring electrode is formed on the same layer as the first electrode and is electrically connected to the exposed portion of the power wirings, and wherein the second electrode is formed over the display area, and contacts at least a portion of the non-display area, and the wiring electrode.

3. The OLED display of claim 2, wherein the first insulating layer includes an upper surface, a side surface, and a bottom surface formed between the first and second insulating layers, and wherein the wiring electrode is formed over the upper, side and bottom surfaces of the first insulating layer and the exposed portion of the power wirings.

4. The OLED display of claim 3, wherein the wiring electrode is integrally formed.

5. The OLED display of claim 2, wherein the contact holes expose a surface of a second one of the insulating layers formed below the first insulating layer.

6. The OLED display of claim 5, wherein the depths of the contact holes are equal to or greater than about 2 micrometers.

7. The OLED display of claim 2, wherein the power wirings, the wiring electrode, and the second electrode are electrically connected to one another so as to form an electrode contact portion.

8. The OLED display of claim 2, wherein the display area includes a plurality of pixels, wherein the intermediate layer comprises an organic emission layer and at least one pattern layer stacked on at least one surface of the organic emission layer, wherein the organic emission layer is formed in each pixel, and wherein the at least one pattern layer is formed over the display area and the non-display area.

9. The OLED display of claim 8, wherein the first insulating layer includes an upper surface and a bottom surface formed between the first insulating layer and a second one of the insulating layers, wherein the at least one pattern layer is formed over the wiring electrode and the upper and bottom surfaces of the first insulating layer, and
wherein the wiring electrode penetrates the at least one pattern layer and is electrically connected to the second electrode.

10. The OLED display of claim 8, wherein the first insulating layer includes a side surface defining the contact holes, wherein the at least one pattern layer is not formed over the side surface of the first insulating layer, and
wherein the second electrode and the wiring electrode are directly connected to each other over the side surface of the first insulating layer.

11. The OLED display of claim 8, wherein the at least one pattern layer comprises at least one of a hole injection layer, a hole transport layer, an electron injection layer, and an electron transport layer.

12. The OLED display of claim 2, wherein the power wirings comprise i) a first wiring formed on the same layer as the gate electrode and ii) a second wiring electrically connected to the first wiring and formed on the same layer as the source and drain electrodes.

13. The OLED display of claim 12, wherein the insulating layers comprise a gate insulating layer, an interlayer insulating layer, a planarization layer, and a pixel-defining layer,
wherein the first wiring and the gate electrode are formed over the gate insulating layer,
wherein the second wiring, the source electrode, and the drain electrode are formed over the interlayer insulating layer, and
wherein the wiring electrode and the first electrode are formed over the planarization layer.

14. A method of manufacturing an organic light-emitting diode (OLED) display including a display substrate, the method comprising:
forming a thin film transistor (TFT) in a display area of the display substrate, wherein the TFT comprises a semiconductor active layer, a gate electrode, a source electrode, and a drain electrode;
forming a plurality of power wirings in a non-display area of the display substrate surrounding the display area;
forming an insulating layer exposing at least a portion of the power wirings and having a plurality of contact holes;
forming a first electrode and an intermediate layer of an OLED in the display area;
forming a wiring electrode on the same layer as the first electrode in the non-display area; and
forming a second electrode of the OLED, wherein the second electrode is electrically connected to the power wirings and the wiring electrode.

15. The method of claim 14, wherein the forming of the insulating layer comprises forming a stair gap between a portion in which the insulating layer is formed and a portion in which the insulating layer is not formed.

16. The method of claim 14, wherein the insulating layer defines the contact holes, and wherein the forming of the wiring electrode comprises forming the wiring electrode over the insulating layer so as to electrically connect the wiring electrode to the exposed portion of the power wirings.

17. The method of claim 16, wherein the insulating layer includes first and second insulating layers, wherein the first insulating layer includes an upper surface, a side surface, and a bottom surface formed between the first and second insulating layers, and wherein the wiring electrode is formed over the upper, side and bottom surfaces of the first insulating layer and the exposed portion of the power wirings.

18. The method of claim 14, wherein the display area includes a plurality of pixels, wherein the intermediate layer comprises an organic emission layer and at least one pattern layer stacked on at least a surface of the organic emission layer, wherein the organic emission layer is formed in each of the pixels, and wherein the at least one pattern layer is formed over the display area and the non-display area.

19. The method of claim 18, wherein the at least one pattern layer comprises at least one of a hole injection layer, a hole transport layer, an electron injection layer, and an electron transport layer,
wherein the insulating layer includes first and second insulating layers, wherein the first insulating layer includes an upper surface, a side surface, and a bottom surface formed between the first and second insulating layers, wherein the at least one pattern layer is formed over the wiring electrode and the upper and bottom surfaces of the first insulating layer, and wherein the at least one pattern layer is not formed over the side surface of the first insulating layer, and
wherein the second electrode and the wiring electrode are directly connected to each other on the side surface of the first insulating layer.

20. The method of claim 19, further comprising irradiating a laser beam onto the upper and bottom surfaces of the first insulating layer toward the second electrode after the second electrode is formed so as to melt the at least one pattern layer between the second electrode and the wiring electrode such that the second electrode penetrates the at least one pattern layer, wherein the at least one pattern layer is electrically connected to the wiring electrode after the irradiating.

* * * * *